(12) United States Patent
Gower et al.

(10) Patent No.: US 8,566,682 B2
(45) Date of Patent: Oct. 22, 2013

(54) FAILING BUS LANE DETECTION USING SYNDROME ANALYSIS

(75) Inventors: Kevin C. Gower, LaGrangeville, NY (US); Lisa C. Gower, legal representative, LaGrangeville, NY (US); Luis A. Lastras-Montano, Cortlandt Manor, NY (US); Patrick J. Meaney, Poughkeepsie, NY (US)

(73) Assignee: International Business Machines Corporation, Armonk, NY (US), `

( * ) Notice: Subject to any disclaimer, the term of this patent is extended or adjusted under 35 U.S.C. 154(b) by 427 days.

(21) Appl. No.: 12/822,498

(22) Filed: Jun. 24, 2010

(65) Prior Publication Data

US 2011/0320921 A1 Dec. 29, 2011

(51) Int. Cl.
*H03M 13/00* (2006.01)

(52) U.S. Cl.
USPC .............. 714/785; 714/4.2; 714/6.3; 714/25; 714/43; 714/47.1; 714/52; 714/56; 714/699; 714/807; 714/808; 370/392; 370/242

(58) Field of Classification Search
None
See application file for complete search history.

(56) References Cited

U.S. PATENT DOCUMENTS

| | | | |
|---|---|---|---|
| 4,360,917 A | | 11/1982 | Sindelar et al. |
| 4,964,129 A | * | 10/1990 | Bowden et al. ............... 714/764 |
| 5,010,544 A | | 4/1991 | Chang et al. |
| 6,024,486 A | | 2/2000 | Olarig et al. |
| 6,557,121 B1 | | 4/2003 | McLaughlin et al. |
| 7,020,076 B1 | | 3/2006 | Alkalai et al. |
| 7,836,352 B2 | * | 11/2010 | Sharma et al. .................. 714/44 |
| 2003/0048859 A1 | | 3/2003 | Wedding |
| 2004/0179527 A1 | * | 9/2004 | Cypher ......................... 370/392 |
| 2005/0088966 A9 | | 4/2005 | Stewart |
| 2005/0132258 A1 | | 6/2005 | Chen et al. |
| 2006/0048018 A1 | | 3/2006 | Hosoya et al. |
| 2006/0181942 A1 | | 8/2006 | Cordero et al. |
| 2006/0212775 A1 | | 9/2006 | Cypher |
| 2007/0011549 A1 | | 1/2007 | Sharma |
| 2007/0116161 A1 | | 5/2007 | Tokoro et al. |
| 2008/0002590 A1 | * | 1/2008 | Thomas et al. ............... 370/242 |
| 2008/0005620 A1 | | 1/2008 | Walker |
| 2008/0005706 A1 | | 1/2008 | Sharma et al. |
| 2010/0005345 A1 | | 1/2010 | Ferraiolo et al. |
| 2010/0005375 A1 | | 1/2010 | Dell et al. |

OTHER PUBLICATIONS

International Search Report and Written Opinion of the ISA dated Oct. 5, 2011—International Application No. PCT/EP2011/059533.
International Search Report and Written Opinion of the ISA dated Sep. 7, 2011—International Application No. PCT/EP2011/059534.
U.S. Appl. No. 12/822,508, filed Jun. 24, 2010.

* cited by examiner

*Primary Examiner* — John Trimmings
(74) *Attorney, Agent, or Firm* — Cantor Colburn LLP

(57) ABSTRACT

Failing bus lane detection using syndrome analysis, including a method for receiving a plurality of syndromes of an error detection code, the error detection code associated with a plurality of frames that have been transmitted on a bus that includes a plurality of lanes and is protected by the error detection code. The method includes performing for each of the lanes in each of the syndromes: decoding the syndrome under an assumption that the lane is a failing lane, the decoding outputting a decode result; determining if the decode result is a valid decode; and voting for the lane in response to determining that the decode result is a valid decode. A failing lane is then identified in response to the voting, with the failing lane being characterized by having more votes than at least one other lane on the bus.

20 Claims, 6 Drawing Sheets

FIG. 2

| | | 12 | 11 | 10 | 9 | 8 | 7 | 6 | 5 | 4 | 3 | 2 | 1 | 0 |
|---|---|---|---|---|---|---|---|---|---|---|---|---|---|---|
| | | \multicolumn{13}{l}{8 TRANSFER FRAME} |
| | | \multicolumn{13}{l}{DOWNSTREAM CHANNEL LANES} |
| BLOCK1 | 0 | 104 | 105 | 106 | 107 | 108 | 109 | 110 | 111 | 112 | 113 | 114 | 115 | 116 |
| | 1 | 117 | 118 | 119 | 120 | 121 | 122 | 123 | 124 | 125 | 126 | 127 | 128 | 129 |
| | 2 | 130 | 131 | 132 | 133 | 134 | 135 | 136 | 137 | 138 | 139 | 140 | 141 | 142 |
| | 3 | 143 | 144 | 145 | 146 | 147 | 148 | 149 | 150 | 151 | 152 | 153 | 154 | 155 |
| BLOCK0 | 0 | crc00 | crc01 | crc02 | crc03 | 160 | 161 | 162 | 163 | 164 | 165 | 166 | 167 | 168 |
| | 1 | crc04 | crc05 | crc06 | crc07 | 173 | 174 | 175 | 176 | 177 | 178 | 179 | 180 | 181 |
| | 2 | crc08 | crc09 | crc10 | crc11 | crc12 | 187 | 188 | 189 | 190 | 191 | 192 | 193 | 194 |
| | 3 | crc13 | crc14 | crc15 | crc16 | crc17 | 200 | 201 | 202 | 203 | 204 | 205 | 206 | 207 |

|  |  | 12 TRANSFER FRAME |  |  |  |  |  |  |  |  |  |  |  |
|---|---|---|---|---|---|---|---|---|---|---|---|---|---|
|  |  | DOWNSTREAM CHANNEL LANES |  |  |  |  |  |  |  |  |  |  |  |
|  |  | 12 | 11 | 10 | 9 | 8 | 7 | 6 | 5 | 4 | 3 | 2 | 1 | 0 |
| BLOCK2 | 0 | 52 | 53 | 54 | 55 | 56 | 57 | 58 | 59 | 60 | 61 | 62 | 63 | 64 |
|  | 1 | 65 | 66 | 67 | 68 | 69 | 70 | 71 | 72 | 73 | 74 | 75 | 76 | 77 |
|  | 2 | 78 | 79 | 80 | 81 | 82 | 83 | 84 | 85 | 86 | 87 | 88 | 89 | 90 |
|  | 3 | 91 | 92 | 93 | 94 | 95 | 96 | 97 | 98 | 99 | 100 | 101 | 102 | 103 |
| BLOCK1 | 0 | 104 | 105 | 106 | 107 | 108 | 109 | 110 | 111 | 112 | 113 | 114 | 115 | 116 |
|  | 1 | 117 | 118 | 119 | 120 | 121 | 122 | 123 | 124 | 125 | 126 | 127 | 128 | 129 |
|  | 2 | 130 | 131 | 132 | 133 | 134 | 135 | 136 | 137 | 138 | 139 | 140 | 141 | 142 |
|  | 3 | 143 | 144 | 145 | 146 | 147 | 148 | 149 | 150 | 151 | 152 | 153 | 154 | 155 |
| BLOCK0 | 0 | crc00 | crc01 | crc02 | crc03 | | | | | | | | | |
|  | 1 | crc04 | crc05 | crc06 | crc07 | | | | | | | | | |
|  | 2 | crc08 | crc09 | crc10 | crc11 | cc12 | 161 | 162 | 163 | 164 | 165 | 166 | 167 | 168 |
|  | 3 | crc13 | crc14 | crc15 | crc16 | cc17 | 174 | 175 | 176 | 177 | 178 | 179 | 180 | 181 |

*Note: Two additional data rows appear between the crc rows:*

|  |  | 12 | 11 | 10 | 9 | 8 | 7 | 6 | 5 | 4 | 3 | 2 | 1 | 0 |
|---|---|---|---|---|---|---|---|---|---|---|---|---|---|---|
|  |  |  |  |  |  | 147 | 148 | 149 | 150 | 151 | 152 | 153 | 154 | 155 |
|  |  |  |  |  |  | 160 | 161 | 162 | 163 | 164 | 165 | 166 | 167 | 168 |
|  |  |  |  |  |  | 173 | 174 | 175 | 176 | 177 | 178 | 179 | 180 | 181 |
|  |  |  |  |  |  |  | 187 | 188 | 189 | 190 | 191 | 192 | 193 | 194 |
|  |  |  |  |  |  |  | 200 | 201 | 202 | 203 | 204 | 205 | 206 | 207 |

FIG. 3

| | | 16 TRANSFER FRAME | | | | | | | | | | | | |
|---|---|---|---|---|---|---|---|---|---|---|---|---|---|---|
| | | DOWNSTREAM CHANNEL LANES | | | | | | | | | | | | |
| | | 12 | 11 | 10 | 9 | 8 | 7 | 6 | 5 | 4 | 3 | 2 | 1 | 0 |
| BLOCK3 | 0 | 0 | 1 | 2 | 3 | 4 | 5 | 6 | 7 | 8 | 9 | 10 | 11 | 12 |
| | 1 | 13 | 14 | 15 | 16 | 17 | 18 | 19 | 20 | 21 | 22 | 23 | 24 | 25 |
| | 2 | 26 | 27 | 28 | 29 | 30 | 31 | 32 | 33 | 34 | 35 | 36 | 37 | 38 |
| | 3 | 39 | 40 | 41 | 42 | 43 | 44 | 45 | 46 | 47 | 48 | 49 | 50 | 51 |
| BLOCK2 | 0 | 52 | 53 | 54 | 55 | 56 | 57 | 58 | 59 | 60 | 61 | 62 | 63 | 64 |
| | 1 | 65 | 66 | 67 | 68 | 69 | 70 | 71 | 72 | 73 | 74 | 75 | 76 | 77 |
| | 2 | 78 | 79 | 80 | 81 | 82 | 83 | 84 | 85 | 86 | 87 | 88 | 89 | 90 |
| | 3 | 91 | 92 | 93 | 94 | 95 | 96 | 97 | 98 | 99 | 100 | 101 | 102 | 103 |
| BLOCK1 | 0 | 104 | 105 | 106 | 107 | 108 | 109 | 110 | 111 | 112 | 113 | 114 | 115 | 116 |
| | 1 | 117 | 118 | 119 | 120 | 121 | 122 | 123 | 124 | 125 | 126 | 127 | 128 | 129 |
| | 2 | 130 | 131 | 132 | 133 | 134 | 135 | 136 | 137 | 138 | 139 | 140 | 141 | 142 |
| | 3 | 143 | 144 | 145 | 146 | 147 | 148 | 149 | 150 | 151 | 152 | 153 | 154 | 155 |
| BLOCK0 | 0 | crc00 | crc01 | crc02 | crc03 | 160 | 161 | 162 | 163 | 164 | 165 | 166 | 167 | 168 |
| | 1 | crc04 | crc05 | crc06 | crc07 | 173 | 174 | 175 | 176 | 177 | 178 | 179 | 180 | 181 |
| | 2 | crc08 | crc09 | crc10 | crc11 | crc12 | 187 | 188 | 189 | 190 | 191 | 192 | 193 | 194 |
| | 3 | crc13 | crc14 | crc15 | crc16 | crc17 | 200 | 201 | 202 | 203 | 204 | 205 | 206 | 207 |

FIG. 4

| TRANSFER | UPSTREAM CHANNEL LANES | | | | | | | | | | | | | | | | | | | |
|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 |
| 0 | 0 | 1 | 2 | 3 | 4 | 5 | 6 | 7 | 8 | 9 | 10 | 11 | 12 | 13 | 14 | 15 | 16 | 17 | 18 | 19 |
| 0 | 0 | 8 | 16 | 24 | 32 | 40 | 48 | 56 | 64 | 72 | 80 | 88 | 96 | 104 | 112 | 120 | 128 | 136 | crc0 | crc8 |
| 1 | 1 | 9 | 17 | 25 | 33 | 41 | 49 | 57 | 65 | 73 | 81 | 89 | 97 | 105 | 113 | 121 | 129 | 137 | crc1 | crc9 |
| 2 | 2 | 10 | 18 | 26 | 34 | 42 | 50 | 58 | 66 | 74 | 82 | 90 | 98 | 106 | 114 | 122 | 130 | 138 | crc2 | crc10 |
| 3 | 3 | 11 | 19 | 27 | 35 | 43 | 51 | 59 | 67 | 75 | 83 | 91 | 99 | 107 | 115 | 123 | 131 | 139 | crc3 | crc11 |
| 4 | 4 | 12 | 20 | 28 | 36 | 44 | 52 | 60 | 68 | 76 | 84 | 92 | 100 | 108 | 116 | 124 | 132 | 140 | crc4 | crc12 |
| 5 | 5 | 13 | 21 | 29 | 37 | 45 | 53 | 61 | 69 | 77 | 85 | 93 | 101 | 109 | 117 | 125 | 133 | 141 | crc5 | crc13 |
| 6 | 6 | 14 | 22 | 30 | 38 | 46 | 54 | 62 | 70 | 78 | 86 | 94 | 102 | 110 | 118 | 126 | 134 | 142 | crc6 | crc14 |
| 7 | 7 | 15 | 23 | 31 | 39 | 47 | 55 | 63 | 71 | 79 | 87 | 95 | 103 | 111 | 119 | 127 | 135 | 143 | crc7 | crc15 |

*FIG. 5*

FAILING BUS LANE DETECTION USING SYNDROME ANALYSIS

BACKGROUND

This invention relates generally to computer memory systems, and more particularly to detection of a failing bus lane using syndrome analysis.

Contemporary high performance computing main memory systems are generally composed of one or more dynamic random access memory (DRAM) devices, which are connected to one or more processors via one or more memory control elements. Overall computer system performance is affected by each of the key elements of the computer structure, including the performance/structure of the processor(s), any memory cache(s), the input/output (I/O) subsystem(s), the efficiency of the memory control function(s), the main memory device(s), and the type and structure of the memory interconnect interface(s).

Extensive research and development efforts are invested by the industry, on an ongoing basis, to create improved and/or innovative solutions to maximizing overall system performance and density by improving the memory system/subsystem design and/or structure. High-availability systems present further challenges as related to overall system reliability due to customer expectations that new computer systems will markedly surpass existing systems in regard to mean-time-between-failure (MTBF), in addition to offering additional functions, increased performance, increased storage, lower operating costs, etc. Other frequent customer requirements further exacerbate the memory system design challenges, and include such items as ease of upgrade and reduced system environmental impact (such as space, power and cooling).

One approach to locating a failing lane in a bus, such as a memory system bus, is to use an error correcting code (ECC). An ECC can detect and correct a number of failing bits, but requires more redundant bits than an error detection code. Typically, an error detection code can detect an error but is not capable of fully resolving the physical nature of the error; for example, it may not be able to fully identify a failing lane for all possible error patterns in the failing lane. Therefore, an error detection code alone may not accurately isolate errors to specific failing lanes. Another approach to detecting a failing lane is lane shadowing, where a copy of data is sent on spare lanes. However, lane shadowing only operates on a subset of lanes at any point in time and can miss error events occurring outside of the analysis window for a given failing lane.

SUMMARY

An embodiment is a computer implemented method for detecting bus failures. The method includes receiving a plurality of syndromes of an error detection code, the error detection code associated with a plurality of frames that have been transmitted on a bus that includes a plurality of lanes and is protected by the error detection code. The method includes performing for each of the lanes in each of the syndromes: decoding the syndrome under an assumption that the lane is a failing lane, the decoding outputting a decode result; determining if the decode result is a valid decode; and voting for the lane in response to determining that the decode result is a valid decode. A failing lane is then identified in response to the voting, with the failing lane being characterized by having more votes than at least one other lane on the bus.

Another embodiment is a system for detecting bus failures that includes a bus interface device configured to receive and trap syndromes for a plurality of frames that have been transmitted on the bus, each frame including multiple bit transfers per lane; and syndrome processing logic in communication with the bus interface device. The syndrome processing logic is configured to perform: receiving a plurality of syndromes of an error detection code, the error detection code associated with a plurality of frames that have been transmitted on a bus, the bus including a plurality of lanes and protected by the error detection code. The syndrome processing logic is also configured to perform for each lane for each syndrome: decoding the syndrome under an assumption that the lane is a failing lane, the decoding outputting a decode result; determining if the decode result is a valid decode; and voting for the lane in response to determining that the decode result is a valid decode. A failing lane is identified in response to the voting; and the failing lane characterized by having more votes than at least one other lane on the bus.

A further embodiment is a computer program product for detecting bus failure. The computer program product includes a computer readable storage medium readable by a processing circuit and storing instructions for execution by the processing circuit for implementing a method. The method includes receiving a plurality of syndromes of an error detection code, the error detection code associated with a plurality of frames that have been transmitted on a bus that includes a plurality of lanes and is protected by the error detection code. The method includes performing for each of the lanes in each of the syndromes: decoding the syndrome under an assumption that the lane is a failing lane, the decoding outputting a decode result; determining if the decode result is a valid decode; and voting for the lane in response to determining that the decode result is a valid decode. A failing lane is then identified in response to the voting, with the failing lane being characterized by having more votes than at least one other lane on the bus.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE SEVERAL VIEWS OF THE DRAWINGS

Referring now to the drawings wherein like elements are numbered alike in the several FIGURES:

FIG. 2 depicts an exemplary downstream eight transfer frame;

FIG. 3 depicts an exemplary downstream twelve transfer frame;

FIG. 4 depicts an exemplary downstream sixteen transfer frame;

FIG. 5 depicts an exemplary upstream eight transfer frame; and

DETAILED DESCRIPTION

Figure 1:
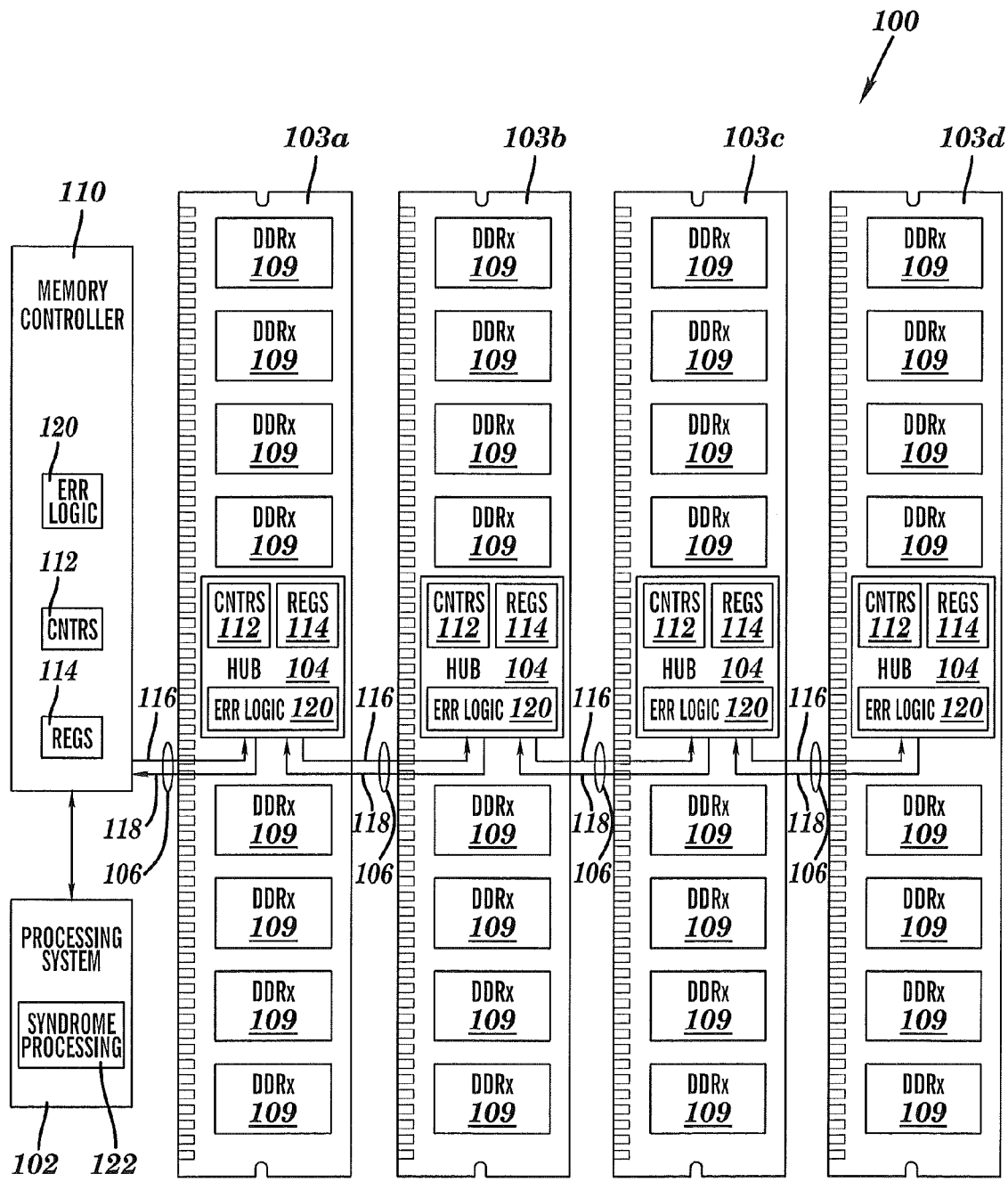
FIG. 1 depicts a cascade interconnect memory system that may be implemented by an exemplary embodiment.

An exemplary embodiment of the present invention locates a failing lane in a bus that is protected using an erparor detection code. Counters and analysis of multiple error detection code syndromes can be used to statistically identify the failing lane. The analysis results in a bit vector with a number of entries equal to the number of lanes in the bus. There is a counter for every lane, which is incremented with the result of the analysis. If the bit vector is equal to zero for a particular lane, the counter for that lane is left untouched; otherwise, it is incremented.

The analysis may not fully resolve which failing lane is the one responsible for the error, and instead gives multiple possibilities for the failing lane. Thus more than one counter may be incremented when a single syndrome is analyzed. This process is repeated several times as new syndromes are received. Although for a single syndrome analysis it may not be possible to resolve the failing lane, as multiple syndromes are analyzed and the accumulated contents of the counters are obtained, the failing lane will have a higher count with high probability. The more syndromes that are analyzed, the better the quality of the result of the analysis. Monitoring for an error condition where one and only one bit failure occurs in a frame transferred on the bus can yield a high accuracy in isolating a failing lane. For instance, 100% accuracy in lane failure identification may be achievable for cases where one and only one bit failure is detected in a frame. The analysis is described in greater detail herein with reference to cyclic redundant checks (CRCs); however, the analysis is applicable to any linear error detection code, and is not limited to only CRCs.

A linear error detection code is characterized by a parity check matrix H. For simplicity, it is assumed that the code operates on binary symbols, although this technique is generally applicable to multibit symbols as well. The number of rows (r) in the parity check matrix H is equal to the number of check bits in the code. The number of columns (n) is equal to n=r+k, where k is the number of payload bits in the error detection code.

Let d be a column vector that denotes the k payload bits, and let c be a column vector that denotes the r bits associated with these k payload bits. The total vector transmitted over the bus is v=[c
d], where c and d have been concatenated to form v. The position of the check bits c need not be on the top of the vector, and also the check bits need not be placed contiguously; this organization is assumed here purely to improve the readability of this description. The check bits c are calculated given the payload d so that H v=0. H v denotes the multiplication of the matrix H times the vector v using matrix/vector multiplication modulus 2. The vector v is then transmitted over a channel which may impart an error on v. This error is denoted by e, which is a vector with n entries with zeros where there is no error and ones where there is an error.

Assuming that there are L lanes in the bus, each lane carries n/L bits throughout the transmission of a frame on the bus. Thus, it is also assumed that n is divisible by L. The vector v can be partitioned in L pieces each with contiguous bits as:

$v = [v1$ $v2$ $...$ $vL]$.

Each of these pieces, including n/L bits, is transmitted over the channel. Similarly, the error vector can be partitioned as:

$e = [e1$ $e2$ $...$ $eL]$.

When a data pattern v+e is received, a decoder calculates the corresponding syndrome using the equation: s=H(v+e)=0+He=He, which does not depend on the vector v. If there were no errors (e=0), then the syndrome s is zero and the frame is deemed good. If s=He is not equal to zero, then an error has been detected and normally a retry would be requested.

Further assume that r>n/L, that is, there are more check bits in the code than bits in any given lane. The matrix H can be partitioned as H=[H1 H2 ... HL]. If there is an error concentrated only in lane i, where e=[0 ... ei ... 0 0] and ei is nonzero, then the received syndrome is s=Hi ei. Hi can be partitioned in two sections, the first section Hi_A containing n/L rows, and the other section Hi_B containing the remaining rows. The partitioning is shown by:

Hi=[Hi_A
Hi_B]

Similarly, the syndrome s can be partitioned as:

s=[s_A
s_B]

Thus, Hi_A is a square matrix with dimensions (n/L)×(n/L) and Hi_B is a matrix with dimensions (r−n/L)×(n/L). Similarly, s_A has n/L entries and s_B has r−n/L entries.

If the code is such that Hi_A is an invertible matrix, then the inverse of Hi_A multiplied by s_A equals ei, which can be expressed as: inv(Hi_A) s_A=ei. This effectively recovers the error pattern ei affecting the lane. It is noted that the property that Hi_A is invertible for every I can be attained for example, by the use of cyclic codes and ensuring that consecutive bits in a lane correspond to consecutive bits in the cyclic code; examples of cyclic codes are the class o BCH codes. As a result of having recovered the error pattern ei, the following equation (the second equality) also holds:

$$mi = H\_i\_B \text{inv}(Hi\_A) s\_A - s\_B = 0 \qquad (1)$$

Note that this equation additionally defines the marker mi using the first equality. Equation (1) is the basis for detection of a failing bus lane. If lane i is the lane with the problem, then the marker mi to the left of equation (1), which only depends on the designed code H and the syndromes s, must be equal to zero. Since it is not known which lane is failing, the left hand side of equation (1) is computed for all L lanes, in essence assuming in turn that each lane is a failing lane, letting index i vary from 1 to L while computing the left hand side of equation (1). For those indices i that result in zero from the computation, the associated lane is declared as a failing lane candidate, and the ith bit of an analysis bitvector vote_lane is set to one, that is, vote_lane[i] is set to 1 (this is referred to herein as "voting for lane i"). For those indices i that have nonzero results from the computation, vote_lane[i] is set to 0 (this is referred to herein as "not voting for lane I") Note that the error magnitude e_i is computed using a subset of the syndromes s_A for each lane, while the crosschecking of the candidate error vector is performed using the remaining syndrome bits s_B. If the crosschecking is successful a valid decode signal is generated, otherwise an invalid decode signal.

The description of the procedure above as applied to one frame does not correspond to a bus error correction procedure as it is known in the art. In a bus error correction procedure, the decoding of a syndrome produces either an uncorrectable error signal or alternately the correction that must be applied to the bus that is believed will remove the data corruption. In contrast, in the procedure above a decoding of each syndrome is performed under an assumption that each lane is a failing lane, and if a valid decode is obtained, that lane receives a vote, with the goal of uncovering a failing lane only after a number of frames have been processed. Thus, a unique failing lane is not always identified when one frame has been processed using an embodiment of the procedure described herein.

As described previously, an exemplary embodiment provides a counter for each bit lane that counts votes for the associated lane being a faulty lane. These counters persist across multiple error detection (and hence syndrome analysis) events, and thus they are also referred to as running counters. The bitvector vote_lane can be used to increment the counters for each bitlane, essentially by adding the value of the bitvector vote_lane to the current value of the counters. There are instances in which for only one lane a zero computation for the marker mi is obtained, but in general, there may be two or more lanes for which a zero computation is obtained in equation (1), which means that the corresponding counters would be incremented.

If a lane has a persistent error but the actual error pattern changes from access to access, the counter for the failing lane gets more increments than the counters for the other lanes. This can be taken advantage of by hardware, firmware or software that keeps track of the counters and determines whether a counter has reached a threshold. If this is so, the corresponding lane is a good candidate for lane sparing.

If the error pattern is a single bit error, then without any ambiguity the failing lane can be correctly identified if the error detection code is suitably designed. In exemplary embodiments, the error detection code employed has the capability of detecting at least any two bits in error. Thus, the syndromes of any two single bit errors cannot be the same. When there is a single bit error, it is impossible for two or more lanes to calculate an ei that has a single bit error and that simultaneously the computation in equation (1) turns out to be zero.

In an alternate exemplary embodiment, instead of computing equation (1), a two stage computation can be performed in equations (2) and (3):

$$ei = \text{inv}(H_i\_A) s\_A \quad (2)$$

$$mi = H_i\_B e\_i - s\_B \quad (3)$$

where the ei is termed the candidate error vector for lane i. For each lane $i = \{1, \ldots, M\}$, it is determined whether there is exactly one bit in error in ei and at the same time, mi=0. Whenever one and only one $i\hat{}*$ is found with this property, optionally a vote is generated for $i\hat{}*$ only, even if there was another i different from $i\hat{}*$ for which mi=0, but for which ei is not exactly one bit in error. This has the effect of slightly sacrificing the error detection capability of the general lane error patterns with the benefit of guaranteeing that all single bits are located with no ambiguity. Said in different words, whenever there exists a candidate error vector that indicates a single bit error, all other possible votes for lanes generated during decoding are cancelled.

Turning now to FIG. 1, an example of a memory system 100 is depicted that includes fully buffered dual in-line memory modules (DIMMs) communicating via a high-speed channel and using the analysis of error detection code syndromes as described herein. The memory system 100 may be incorporated in a host processing system as main memory for processing system 102. The memory system 100 includes a number of DIMMs 103a, 103b, 103c and 103d with hub devices 104 communicating via a channel 106 or a cascade-interconnected bus (made up of a differential unidirectional upstream bus 118 and a differential unidirectional downstream bus 116). The DIMMs 103a-103d can include multiple memory devices 109, which may be double data rate (DDR) dynamic random access memory (DRAM) devices, as well as other components known in the art, e.g., resistors, capacitors, etc. The memory devices 109 are also referred to as DRAM 109 or DDRx, as any version of DDR may be included on the DIMMs 103a-103d, e.g., DDR2, DDR3, DDR4, etc. A memory controller 110 interfaces with DIMM 103a, sending commands, address and data values via the channel 106 that may target any of the DIMMs 103a-103d. The commands, address and data values may be formatted as frames and serialized for transmission at a high data rate. The hub devices 104 and the memory controller 110 may be referred to generically as bus interface devices.

In an exemplary embodiment, when a DIMM receives a frame from an upstream DIMM or the memory controller 110, it redrives the frame to the next DIMM in the daisy chain (e.g., DIMM 103a redrives to DIMM 103b, DIMM 103b redrives to DIMM 103c, etc.). At the same time, the DIMM decodes the frame to determine the contents. Thus, the redrive and command decode at a DIMM can occur in parallel, or nearly in parallel. If the command is a read request, all DIMMs 103a-103d and the memory controller 110 utilize contents of the command to keep track of read data traffic on the upstream bus 118.

The hub devices 104 on the DIMMs 103a-103d receive commands via a bus interface (e.g., a port) to the channel 106. The bus interface on the hub device 104 includes, among other components, a receiver and a transmitter. In an exemplary embodiment, each hub device 104 includes both an upstream bus interface for communicating with an upstream hub device 104 or memory controller 110 via the channel 106 and a downstream bus interface for communicating with a downstream hub device 104 via the channel 106. The hub devices 104 also include counters 112, registers 114, and error handling logic 120. Similarly, the memory controller 110 can also include counters 112, registers 114, and error handling logic 120. The counters 112 may function as error counters used by the error handling logic 120 to calculate error rates and set fault conditions in registers 114. The counters 112 may be implemented in software, firmware, hardware, or some combination thereof. Detailed processing of syndromes to identify specific failing lanes can be off-loaded to syndrome processing logic 122 of processing system 102.

Although only a single memory channel 106 is shown in FIG. 1 connecting the memory controller 110 to a single memory device hub device 104, systems produced with these modules may include more than one discrete memory channel from the memory controller 110, with each of the memory channels operated singly (when a single channel is populated with modules) or in parallel (when two or more channels are populated with modules) to achieve the desired system functionality and/or performance. Moreover, any number of lanes can be included in the channel 106. For example, the downstream bus 116 can include 13 bit lanes, 2 spare lanes and a clock lane, while the upstream bus 118 may include 20 bit lanes, 2 spare lanes and a clock lane.

An exemplary embodiment of the downstream CRC is selected selected/applied such that 8, 12 and 16 transfer frames are supported (in an exemplary embodiment, 13 bit-lanes are included in each transfer). The downstream CRC detects any lane failure, any transfer failure, and up to 5 bit random errors. In addition, if a downstream CRC error is detected, contents of the downstream frame are ignored and a failure information register (FIR) bit is set in registers 114. The FIR is an architected means of storing information about a failure that is detected within the hub device 104. The FIR can be interrogated by the memory controller 110 and/or other system elements to determine what action, if any, needs to be performed. In response to the FIR bit being set, an error recovery state can be entered if the system 100 is enabled to do so. A "conventional" location for check bits is at the beginning or the end of codeword. An exemplary embodiment of the downstream code is designed so that the check bit positions are in a "non-conventional" location. This non-conventional location is desirable because of issues related to how the protocol is designed. In addition, putting the checkbits in a conventional place and then moving them around can break important properties of the code (e.g., all lane fail detect, etc.). Furthermore not all locations are feasible to provide CRC detection. The non-conventional location of the check bit positions are exploited by an exemplary downstream frame format described herein.

The upstream CRC is selected/applied such that up to 20 bitlanes are covered for up to 8 transfers, and so that it detects any lane failure, any transfer failure (with an escape rate of $2^{}(-16)$), and up to 4 random errors. In addition, all upstream hubs devices 104 monitor upstream CRC data as it passes through the hub device 104 to detect upstream CRC errors, and any detected error results in that hub device 104** interrupting all read traffic, forwarding a poisoned CRC, setting a FIR bit, and entering error recovery state.

In an exemplary embodiment, the downstream CRC (error detection) code is utilized on a 13 lane×16 beat (maximum) frame format. This CRC code can detect: any lane failure, any transfer failure, and up to 5 bit random errors. Also, among other things, the random silent error rate is about two to the power of negative seventeen ($\sim 2^{**}(-17)$).

An exemplary embodiment of the CRC polynomial is: $g(x)=1+x+x^3+x^4+x^5+x^8+x^{12}+x^{13}+x^{15}+x^{16}+x^{17}+x^{18}$. This is a Bose Chaudhuri Hocquenghem (BCH) code that has five consecutive zeros (among other zeros). This exemplary code has a minimum distance of six. The base code actually only requires 17 bits so an additional bit has been added artificially to give the appropriate length.

FIG. 2 depicts an exemplary downstream eight transfer frame that utilizes an embodiment of the channel CRC described herein. FIG. 3 depicts an exemplary downstream twelve transfer frame that utilizes an embodiment of the channel CRC described herein. Similarly, FIG. 4 depicts an exemplary downstream sixteen transfer frame that utilizes an embodiment of the channel CRC described herein. As depicted in FIGS. 2-4, the CRC bit positions are: 156, 157, 158, 159, 169, 170, 171, 172, 182, 183, 184, 185, 186, 195, 196, 197, 198, and 199. After computing a generic parity check, matrix Gaussian elimination was used to obtain a matrix suitable for calculating the CRC bits in the positions given above. While a standard shift-register implementation can be used for both encoding and decoding the CRC, for high-speed buses, a parallel approach with exclusive-ORs may be preferred. In order for CRC logic in the error handling logic 120 to be reused, the CRC is defined for the longest frame size, which is 208 bits for the 16 transfer frame. Any frame that does not use all 208 bits simply sets all unused bits to zero.

An embodiment of the basic CRC algorithm encodes CRC checkbits and transmits them across the bus per the frame protocol. After the data is received by the checker on the other end of the bus (e.g., in a hub device 104 of FIG. 1), a new or regenerated set of CRC checkbits is computed. The received CRC checkbits and the regenerated CRC checkbits are then compared (XOR'd) to form the syndrome vector. If the syndrome is a bitwise 0 vector, then no error is assumed to have occurred in the transmission of the data. Any non-zero syndrome indicates an error has occurred. This implementation, as with standard CRC's, does not support direct error isolation by examination of the syndrome. When the hub device 104 of FIG. 1 detects a downstream CRC error it ignores all contents of the downstream frame, sets the appropriate FIR bit, poisons, and forwards the faulty CRC and, if enabled, enters the error recovery state.

The counters 112 of FIG. 1 include configurable counters for each receiver link to calculate a CRC error rate. The counters 112 of FIG. 1 may also include error counters for each signal lane recording the results of each CRC syndrome analyzed. Error rate logic in the error handling logic 120 of FIG. 1 increments a timer for each run time, memory channel frame and also counts any detected non-poison CRC errors in using counters 112. In a manner similar to the description for the downstream case, each failing CRC syndrome is analyzed by the syndrome processing logic 122 to determine possible failing lanes, communicated by the logic by voting on those lanes that may be failing. The CRC is powerful enough to uniquely identify the failing lane for all single bit errors in a frame and correctly identify the failing lane during a random lane failure for a statistically significant number of failures. Since CRC error correction is not powerful enough to guarantee unique error detection for completely random lane errors, multiple failure candidates may possibly be identified. The lane error counters in counters 112 increment each time their lane is identified as a failure candidate (because a vote was generated for it). When the memory channel 106 is operating normally, all lane error counters in counters 112 will periodically be cleared, as the CRC error threshold is not exceeded. When the memory channel 106 develops an intermittent error that cannot be repaired by re-initialization, the CRC error counter in the counters 112 will exceed its configurable threshold. At this point all lane error counters in counters 112 will freeze, and a FIR bit will be set in registers 114 to request attention.

The syndrome processing logic 122 can service the attention request by reading the lane error counters in the counters 112 and determining which lane, (if any) should be repaired. Even though multiple lane failure candidates may be identified on each CRC error, when the error counters have accumulated enough CRC syndrome analysis results to exceed the threshold, there will likely be a clear statistical indicator of the lane that is failing most often. If a spare lane is available to repair the identified failure, the processing system 102 can issue a command that deactivates the failing lane. This changes the intermittent failure into a hard failure that can be detected and repaired by the subsequent re-initialization and repair sequence automatically initiated by the memory controller 110 and/or hub devices 104.

In an exemplary embodiment, each receiver in the channel 106 also includes dedicated trap registers in registers 114 to record the results of one failing CRC syndrome. The trap registers can be configured to record the first CRC error detected or continuously update to the latest CRC error detected. A valid bit is set in the trap register when a new error is captured and it is automatically reset when the trap register is read by the processing system 102.

In an exemplary embodiment, if the voting does not isolate one lane significantly above the other lanes, then one of the lanes is selected and repaired. The new error rate is then monitored. If the new error rate after the repair is not significantly (e.g., within a threshold) better than the previous error rate, then the first repair is backed-off (undone) and another lane is selected and repaired. This processing, of repairing and backing-off may continue until the new error rate is significantly better than the previous error rate. In an exemplary embodiment, if more than one lane repair is allowed, then more than one lane is selected for repair from the top contenders. In this manner, a plurality of repairs may be performed.

FIG. 5 depicts an exemplary upstream 8 transfer frame that utilizes an embodiment of the channel CRC described herein. The upstream CRC is described as follows for an 8 transfer frame format along with its CRC and error checking bit numbers. This code is intended for use on a 20 lane×8 beat frame format. It can detect any lane failure, any transfer failure (transfer failures escape from the code with a probability 2\*\*(−16)), and up to 4 bit random errors.

In an exemplary embodiment, the upstream CRC polynomial is: $g(x)=1+x+x^2+x^5+x^7+x^8+x^9+x^{10}+x^{11}+x^{15}+x^{16}$. This is a BCH code that has four consecutive zeros (among other zeros). Therefore, it has a minimum distance 5. The polynomial for the code for the downstream format was obtained by multiplying the code for the upstream format by $1+x^2$. The CRC bit positions as depicted in FIG. 5 are 144, 145, 146, 147, 148, 149, 150, 151, 152, 153, 154, 155, 156, 157, 158, and 159.

An exemplary CRC algorithm includes encoding the CRC checkbits and transmitting them across the bus per the frame protocol. After the data is received by the checker (e.g., in a hub device 104 of FIG. 1) on the other end of the bus, a new or regenerated set of CRC checkbits is computed. The received CRC checkbits and the regenerated CRC checkbits are then compared (XOR'd) to form the syndrome vector. If the syndrome is a bitwise 0 vector, then no error is assumed to have occurred in the transmission of the data. Any non-zero syndrome indicates an error has occurred. This implementation, as with most CRCs, does not support direct error isolation by examination of the syndrome.

While this description has been focused on downstream and upstream frames with specific number of lanes and transfers, and error detection codes for up to a specific number of single bit errors, lane errors and potentially transfer errors, it is possible to design error detection codes for other parameters. The techniques described herein can be applied to a variety of communication busses that employ error detection codes and are not limited to memory system applications.

In an exemplary embodiment, hub devices 104 may be connected to the memory controller 110 of FIG. 1 through a multi-drop or point-to-point bus structure (which may further include a cascade connection to one or more additional hub devices 104). Memory access requests are transmitted by the memory controller 110 through the bus structure (e.g., the memory bus) to the selected hub device(s) 104. In response to receiving the memory access requests, the hub device 104 translates the memory access requests to control the memory devices 109 to store write data from the hub device 104 or to provide read data to the hub device 104. Read data is encoded into one or more communication frame(s) and transmitted through the memory bus(es) to the memory controller 110.

In alternate exemplary embodiments, the memory controller(s) 110 may be integrated together with one or more processor chips and supporting logic, packaged in a discrete chip (commonly called a "northbridge" chip), included in a multichip carrier with the one or more processors and/or supporting logic, or packaged in various alternative forms that best match the application/environment. Any of these solutions may or may not employ one or more narrow/high speed links to connect to one or more hub chips and/or memory devices.

Figure 6:
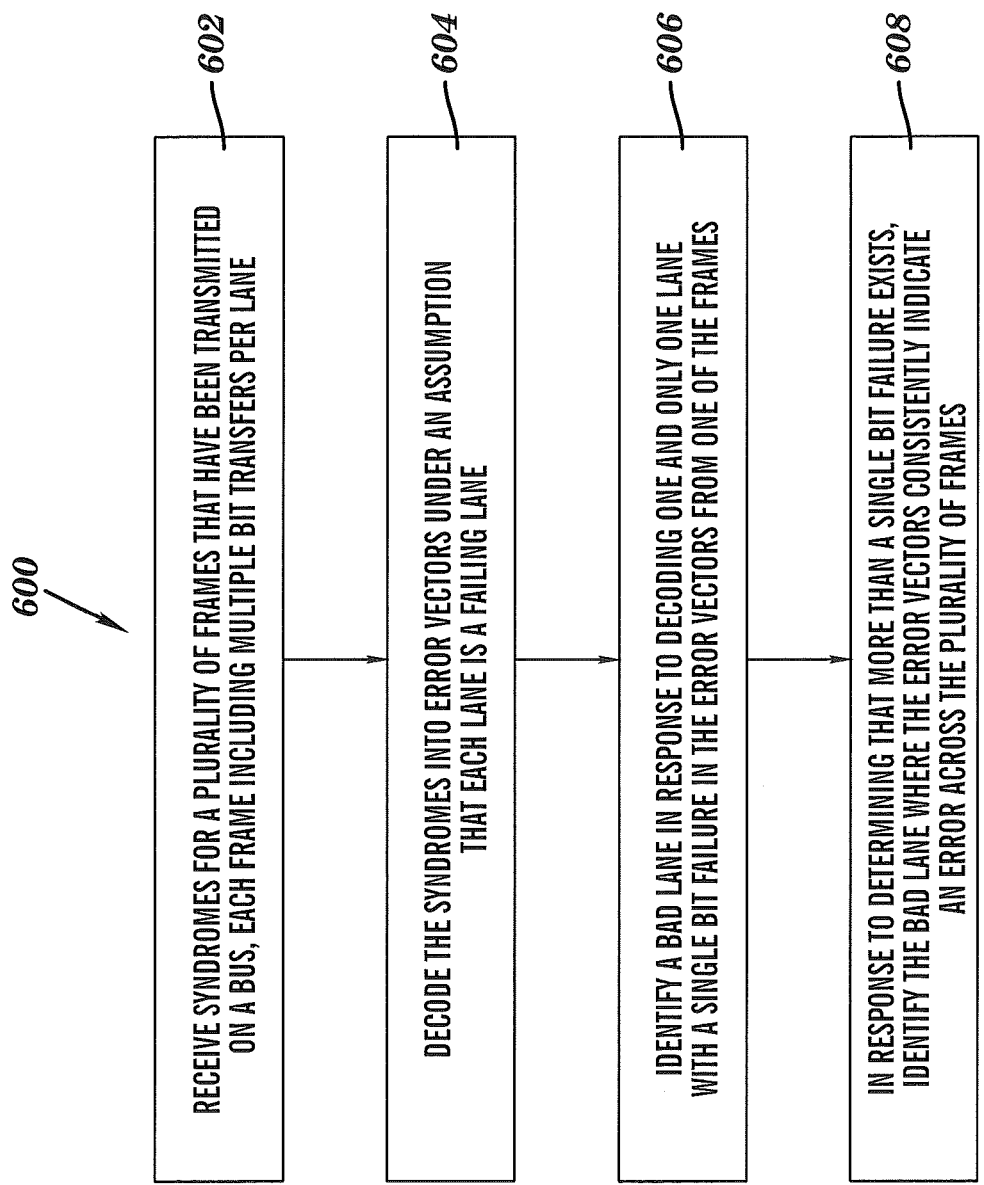
FIG. 6 depicts an exemplary process for detection of a failing bus lane using syndrome analysis.

FIG. 6 depicts an exemplary process 600 for detection of a failing bus lane using syndrome analysis. At block 602, the syndrome processing logic 122 of FIG. 1 receives syndromes for a plurality of frames that have been transmitted on a bus, such as upstream bus 118 of FIG. 1, where each frame includes multiple bit transfers per lane as depicted in FIGS. 2-5. The syndromes may be trapped values from a bus interface device, such as memory controller 110 or hub device 104. The syndromes can be trapped in registers 114 of FIG. 1 and a fault indication set when error detection logic 120 determines that counters 112 have exceeded a threshold to initiate more detailed syndrome analysis for isolation of error conditions.

At block 604, the syndrome processing logic 122 decodes the syndromes into error vectors under an assumption that each lane is a failing lane. The error vectors select specific syndrome bits in combinations that would contribute to an error condition. Since the same syndrome bits can be involved in multiple error vector calculations, it may not be possible to isolate the error to a single lane for all possible error combinations.

At block 606, the syndrome processing logic 122 identifies a bad lane in response to decoding one and only one lane with a single bit failure in the error vectors from one of the frames. The syndrome processing logic 122 may also determine whether verification bits for the syndromes agree about the error vectors decoded from the syndromes, where the verification bits provide a degree of redundancy in the error detection code. The verification bits can be used in combination with the error vectors to vote for the bad lane. In response to decoding the one and only one lane with the single bit failure, the syndrome processing logic 122 may clear votes for all other lanes to ensure 100% error identification accuracy for the single bit failure.

At block 608, in response to determining that more than a single bit failure exists, the syndrome processing logic 122 identifies the bad lane where the error vectors consistently indicate an error across the plurality of frames using an embodiment of the voting process described herein. In an embodiment, the syndrome processing logic 122 compares the number of votes received to determine if an error is consistently indicated. The comparing can include calculating a ratio of lanes with a higher number of votes to lanes with a lower number of votes, and then comparing the calculated ratio relative to a ratio threshold value. For instance, a lane may be declared as the bad lane if it indicates a failure four or more times as often as other lanes. The comparing can be performed after a predetermined number of syndromes are analyzed to ensure a statistically significant sample set is used. In an exemplary embodiment, the running counters are reset after identifying the bad lane and initiating a corrective action, such as resetting the bus interface device, using a spare lane, or retraining the bus lanes. In another exemplary embodiment, the running counters are reset after a prescribed amount of time.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, it will be understood that the use of the terms first, second, etc. do not denote any order or importance, but rather the terms first, second, etc. are used to distinguish one element from another.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The capabilities of the present invention can be implemented in software, firmware, hardware or some combination thereof.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized to store instructions for execution of the syndrome processing logic 122 of FIG. 1. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

What is claimed is:

1. A computer implemented method for detecting bus failures, the method comprising:
receiving a plurality of syndromes of an error detection code, the error detection code associated with a plurality of frames that have been transmitted on a bus, the bus comprising a plurality of lanes and protected by the error detection code, each of the lanes having an associated running counters storing values;
performing for each of the syndromes:
performing for each of the lanes:
decoding the syndrome under an assumption that the lane is a failing lane, the syndrome indicating multiple possible failing lanes for a single error, the decoding outputting a decode result;
determining if the decode result is a valid decode; and
voting for the lane in response to determining that the decode result is a valid decode, the voting comprising incrementing the running counter associated with the lane, wherein the incrementing is repeated for each of the possible failing lanes for the single error; and
identifying a failing lane from the possible failing lanes in response to the voting, the identifying comprises comparing the values in the running counters relative to each other to select the failing lane, the failing lane characterized by having more votes than at least one other lane on the bus.

2. The method of claim 1, wherein the decoding comprises generating a candidate error vector for the lane and canceling out the voting for other lanes generated by decoding the syndrome in response to the candidate error vector indicating a single bit error.

3. The method of claim 1, wherein the failing lane is characterized by having at least as many votes as any other lane on the bus.

4. The method of claim 1, wherein the comparing calculates a ratio of higher running counter values to lower running counter values, and the identifying further comprises comparing the calculated ratio relative to a ratio threshold value to select the failing lane.

5. The method of claim 1, wherein the identifying is performed after a specified number of the syndromes are received.

6. The method of claim 1, wherein the decoding is performed for a subset of the syndromes that are received and comprises generating a candidate error vector, wherein the syndromes that are received and are not in the subset are utilized by the decoding to crosscheck the candidate error vector.

7. The method of claim 1, wherein the voting is reset in response to identifying the failing lane and to initiating a corrective action.

8. The method of claim 1, wherein the voting is reset after a specified amount of time.

9. A system for detecting bus failures, the system comprising:
a bus interface device configured to receive and trap syndromes for a plurality of frames that have been transmitted on a bus, the bus comprising a plurality of lanes, each frame comprising multiple bit transfers per lane;
a plurality of running counters associated with the lanes for storing values; and
syndrome processing logic in communication with the bus interface device, the syndrome processing logic configured to perform:
receiving a plurality of syndromes of an error detection code, the error detection code associated with a plurality of frames that have been transmitted on the bus, the bus protected by the error detection code;
performing for each of the syndromes:
performing for each of the lanes:
decoding the syndrome under an assumption that the lane is a failing lane, the syndrome indicating multiple possible failing lanes for a single error, the decoding outputting a decode result;
determining if the decode result is a valid decode; and
voting for the lane in response to determining that the decode result is a valid decode, the voting comprising incrementing a running counter associated with the lane, wherein the incrementing is repeated for each of the possible failing lanes for the single error; and
identifying a failing lane from the possible failing lanes in response to the voting, the identifying comprises comparing the values in the running counters relative to each other to select the failing lane, the failing lane characterized by having more votes than at least one other lane on the bus.

10. The system of claim 9, wherein the decoding comprises generating a candidate error vector for the lane and canceling out the voting for other lanes generated by decoding the syndrome in response to the candidate error vector indicating a single bit error.

11. The system of claim 9, wherein the failing lane is characterized by having at least as many votes as any other lane on the bus.

12. The system of claim 9, wherein the comparing calculates a ratio of higher running counter values to lower running counter values, and the identifying further comprises comparing the calculated ratio relative to a ratio threshold value to select the failing lane.

13. The system of claim 9, wherein the identifying is performed after a specified number of the syndromes are received.

14. The system of claim 9, wherein the decoding is performed for a subset of the syndromes that are received and comprises generating a candidate error vector, wherein the syndromes that are received and are not in the subset are utilized by the decoding to crosscheck the candidate error vector.

15. The system of claim 9, wherein the voting is reset in response to identifying the failing lane and to initiating a corrective action.

16. The system of claim 9, wherein the voting is reset after a specified amount of time.

17. The system of claim 9 wherein the bus interface device is a hub device in a memory system.

18. The system of claim 9 wherein the bus interface device is a memory controller in a memory system.

19. A computer program product for detecting bus failure, the computer program product comprising:

a tangible computer readable storage medium readable by a processing circuit and storing instructions for execution by the processing circuit for implementing a method, the method comprising:
  receiving a plurality of syndromes of an error detection code, the error detection code associated with a plurality of frames that have been transmitted on a bus, the bus comprising a plurality of lanes and protected by the error detection code, each of the lanes having an associated running counters storing values;
  performing for each of the syndromes:
    performing for each of the lanes:
      decoding the syndrome under an assumption that the lane is a failing lane, the syndrome indicating multiple possible failing lanes for a single error, the decoding outputting a decode result;
      determining if the decode result is a valid decode; and
      voting for the lane in response to determining that the decode result is a valid decode, the voting comprising incrementing the running counter associated with the lane, wherein the incrementing is repeated for each of the possible failing lanes for the single error; and
    identifying a failing lane from the possible failing lanes in response to the voting, the identifying comprises comparing the values in the running counters to relative each other to select the failing lane, the failing lane characterized by having more votes than at least one other lane on the bus.

20. The computer program product of claim 19, wherein the decoding comprises generating a candidate error vector for the lane and canceling out the voting for other lanes generated by decoding the syndrome in response to the candidate error vector indicating a single bit error.

* * * * *